United States Patent [19]

Mizuno et al.

[11] Patent Number: 5,466,325
[45] Date of Patent: Nov. 14, 1995

[54] RESIST REMOVING METHOD, AND CURABLE PRESSURE-SENSITIVE ADHESIVE, ADHESIVE SHEETS AND APPARATUS USED FOR THE METHOD

[75] Inventors: Fumio Mizuno; Noboru Moriuchi; Seiichiro Shirai, all of Tokyo; Yutaka Moroishi, Osaka; Makoto Sunakawa, Osaka; Michirou Kawanishi, Osaka, all of Japan

[73] Assignees: Nitto Denko Corporation, Osaka; Hitachi Ltd., Tokyo, both of Japan

[21] Appl. No.: 288,988

[22] Filed: Aug. 11, 1994

Related U.S. Application Data

[63] Continuation of Ser. No. 70,299, Jun. 2, 1993, abandoned.

[51] Int. Cl.[6] .............................. B32B 7/10; B32B 31/00
[52] U.S. Cl. .......................... 156/344; 156/234; 156/241; 156/275.5; 156/275.7
[58] Field of Search ..................................... 156/230, 234, 156/235, 241, 275.5, 275.7, 344

[56] References Cited

U.S. PATENT DOCUMENTS

| | | | |
|---|---|---|---|
| 4,233,395 | 11/1980 | Klüpfel et al. | 430/271 |
| 4,497,686 | 2/1985 | Weglin | 156/651 |
| 4,631,110 | 12/1986 | Tsumura et al. | 156/344 X |
| 4,869,767 | 9/1989 | Robinson et al. | 156/233 |
| 5,110,388 | 5/1992 | Komiyama et al. | 156/275.5 X |

Primary Examiner—David A. Simmons
Assistant Examiner—Paul M. Rivard
Attorney, Agent, or Firm—Sughrue, Mion, Zinn, Macpeak & Seas

[57] ABSTRACT

A method for removing a resist pattern formed on a semiconductor wafer, and a curable pressure-sensitive adhesive, adhesive sheets and an apparatus used for the method. The resist-removing method comprising adhering an adhesive tape on an upper surface of a resist pattern formed on an article and peeling off the resist pattern together with the adhesive tape; the curable pressure-sensitive adhesive constituting the adhesive tape, comprising a pressure-sensitive adhesive polymer containing a non-volatile compound having at least one unsaturated double bond in the molecule and having a good affinity with a resist material to be removed; the adhesive sheet comprising a film substrate having formed thereon the curable pressure-sensitive adhesive; and the resist-removing apparatus comprising a means for press-adhering the adhesive tape, a tape-peeling means, and a substrate-washing means.

2 Claims, 2 Drawing Sheets

RESIST REMOVING METHOD, AND CURABLE PRESSURE-SENSITIVE ADHESIVE, ADHESIVE SHEETS AND APPARATUS USED FOR THE METHOD

This is a File Wrapper Continuation of Application Ser. No. 08/070,299 filed Jun. 2, 1993, now abandoned.

FIELD OF THE INVENTION

The present invention relates to resist-removing techiques. More particularly, it relates to a method for removing a resist pattern formed on a semiconductor wafer, and a curable pressure-sensitive adhesive, adhesive sheets and an apparatus used for the method.

BACKGROUND OF THE INVENTION

In production step of a semiconductor integrated circuit device, circuit elements and/or wirings are formed on a semiconductor wafer by forming a resist pattern on the semiconductor wafer, etching a thin film (e.g., an oxidized film or a deposited film) on the semiconductor wafer using the resist pattern as a mask, and injecting impurity ions into specific regions of a substrate.

For forming a resist pattern on a semiconductor wafer, a photoresist is first spin-coated on the semiconductor wafer. The photoresist used is a composition prepared by diluting, for example, a novolak resin and a photosensitizer with an organic solvent. After removing the organic solvent by heating the photoresist thus formed, latent images are formed at the desired pattern regions by irradiating the surface of the photoresist with an exposing light such as an ultraviolet ray, an electron beam, laser, etc. The photoresist is then developed by, for example, a wet treatment with an alkali developer.

On the other hand, the resist pattern which has become unnecessary after etching step or the ion-injection step is removed from the semiconductor wafer by ashing. As the ashing method, there are a method of using $O_2$ plasma and a method of using ultraviolet rays and ozone. In addition, the ashing technique is described in, e.g., '90 Saishin Handotai Process Gijutsu (Newest Semiconductor Process Technique), page 220–229, published by K. K. Press Journal, Nov. 2, 1992.

However, the conventional ashing technique involves a problem that impurites such as sodium, heavy metals, etc., contained in a photoresist remain on the semiconductor wafer after ashing and these impurities diffuse in the inside of the wafer by the subsequent heat-treatment to deteriorate the characteristics of the semiconductor element.

Furthermore, the conventional ashing technique also has a problem that it is difficult to remove the resist pattern denatured by the ion injection.

SUMMARY OF THE INVENTION

The present invention has been accomplished under the above-described circumstances in conventional techniques.

Accordingly, one object of the present invention is to provide a technique capable of preventing contamination of a semicondutor wafer with metallic impurities contained in a photoresist.

Another object of the present invention is to provide a technique capable of easily removing a resist pattern denatured by an ion injection, formed on a semiconductor wafer.

Further object of the present invention is to provide a curable pressure-sensitive adhesive which is suitably used to remove a resist pattern formed on a semiconductor wafer.

The above-described and other objects and the novel features of the present invention will become appraent from the following description of the specification and the attached drawings.

According to one embodiment of the present invention, there is provided a resist-removing method, which comprises adhering an adhesive tape onto a surface of a resist pattern formed on an article and peeling off the resist pattern together with the adhesive tape.

According to another embodiment of the present invention, there is provided a curable pressure-sensitive adhesive for removing a resist, comprising a non-volatile compound having at least one unsaturated double bond in the molecule and having a good affinity with the resist material, the pressure-sensitive adhesive being used as an adhesive for the adhesive tape for use in the resist-removing method described above.

DETAILED DESCRIPTION OF THE INVENTION

In the resist-removing method of the present invention, by mechanically peeling off a resist pattern formed on, e.g., an semicondictor wafer with an adhesive tape, metallic impuriries contained in the resist can be simultaneously removed. Also, in the method of the present invention, even the resist pattern denatured by an ion injection can be easily removed. Furthermore, by using a curable adhesive, in particular, by using a curable pressure-sensitive adhesive comprising a pressure-sensitive adhesive polymer containing a non-volatile compound having at least one unsaturated double bond in the molecule and having a good affinity with the resist material as the adhesive for the adhesive tape, the adhesive is integrated with the resist material by pressing or heat-pressing, whereby the resist pattern can be easily removed together with the adhesive tape by peeling off the adheisve tape.

The present invention is explained in more detail by referring to the accompanying drawings.

Figure 1:
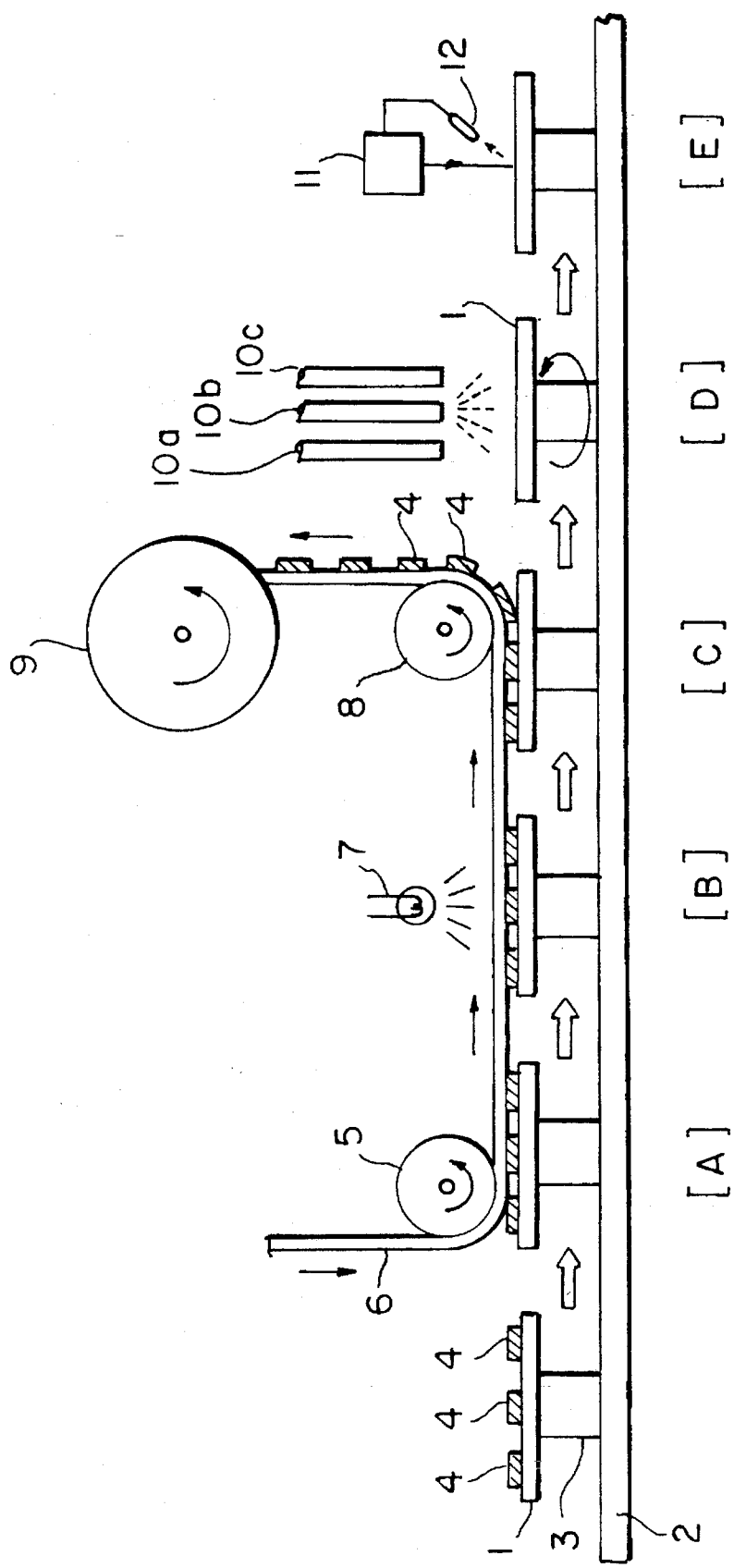
FIG. 1 is a schematic view showing one example of the resist-removing apparatus of the present invention used in the resist-removing method of the present invention.

FIG. 1 is a schematic view showing one example of the resist-removing apparatus of the present invention used in a resist-removing method which is also one example (Embodiment 1) of the present invention.

As shown in FIG. 1, each semiconductor wafer 1, for example, a dry etching step of which has been finished, is mounted on a vacuum chuck 3 on a wafer-transporting belt 2 moving to the horizontal direction at a constant speed. On the semiconductor wafer 1 is formed a resist pattern 4 which was used as a mask for etching. The resist pattern 4 is composed of a positive-working photoresist comprising, e.g., a novolac resin and a photosensitizer.

The semiconductor wafer 1 is first transported to an adhesive tape adhering step shown by [A] in FIG. 1. In the tape adhering step [A], a 1st roll 5 as a means for adhering the adhesive tape is disposed. The roll 5 presses the adhesive surface of the adhesive tape 6 supplied from an adhesive tape-supplying means (not shown) at a constant speed onto the semiconductor wafer 1 to closely adhere the adhesive tape 6 to the resist pattern.

The adhesive tape 6 is a tape prepared by coating an adhesive (or a pressure-sensitive adhesive) on one surface of a transparent tape substrate comprising, e.g., a polyester film or an ethylene-vinyl acetate copolymer film. In this case, for preventing the occurrence of staining the surface of the semiconductor wafer 1, it is preferred to use the adhesive (or pressure-sensitive adhesive) having a content of metallic impurities of 10 ppm or less.

The semiconductor wafer 1 is then transported to an adhesion-strengthening step shown by [B]. In the adhesion-strengthening step [B], an adhesion strengthening means 7 for strengthening the adhesion between the adhesive tape 6 and the resist pattern 4 is disposed.

The adhesion strengthening means 7 differs according to the type of the adhesive (or pressure-sensitive adhesive) used for the adhesive tape, but when the adhesive is, for example, an ulrtaviolet ray curable adhesive resin, an ultraviolet lamp, etc., is used as the adhesion strengthening means. In this case, for accelerating curing of the adhesive by the irradiation with ultraviolet rays, a heater may be disposed, e.g., in the vacuum chuck 3 to heat the semiconductor wafer 1.

In addition, if the sufficient adhesion between the resist pattern 4 and the adhesive tape 6 is obtained in the adhesive tape adhering step [A], the adhesion strengthening step [B] may be omitted.

The semiconductor wafer 1 is then transported to a tape peeling off step shown by [C] together with the adhesive tape 6. In the tape peeling off step [C], a roll 8 as a tape peeling means and a tape winding reel 9 are disposed. In the step [C], the adhesive tape 6 is mechanically peeled off from the semiconductor wafer 1 together with the resist pattern 4 and recovered by the tape winding reel 9.

In peeling off the adhesive tape, there is a possibility to break a device formed on the semiconductor wafer 1 by static electricity generated on the adhesive tape. Thus, for preventing the generation of static electricity, it is preferred to render the adhesive tape electrically conductive or conrtol the peeling atmosphere to a state that static electricity is reluctant to generate.

The semiconductor wafer 1, from which the resist pattern 4 has been removed as described above, is then transported to a wafer washing step shown by [D]. In the wafer washing step [D], nozzles 10a, 10b, and 10c as wafer washing means are disposed and in a state of rotating the vacuum chuck in the horizontal direction, a developer is first supplied onto the semiconductor wafer 1 from 1st nozzle 10a to remove a slight amount of the photoresist residue remaining on the semiconductor wafer 1. Thereafter, the adhesive residue is removed with an organic solvent supplied from the 2nd nozzle 10b, and the residues of the developer and the organic solvent are then removed with ultra pure water supplied from the 3rd nozzle 10c.

As a matter of course, a dry washing step such as a light washing step can be used in place of the wet washing step described above.

The semiconductor wafer 1 is then transported to a wafer inspecting step shown by [E]. In the wafer inspecting step [E], the surface of the semiconductor wafer 1 is scanned by a laser light irradiated from a laser light source 11 and by detecting the scattered light by a sensor 12, the presence or the absence of foreign matters on the surface of the semiconductor wafer is inspected.

When the presence of foreign matters on the wafer is detected in the wafer inspecting step [E], the semicondctor wafer 1 is re-transported to the adhesive tape adhering step [A] by means of a wafer-transporting belt 2 and then subjected to the series of the same steps described above again.

Figure 2A:
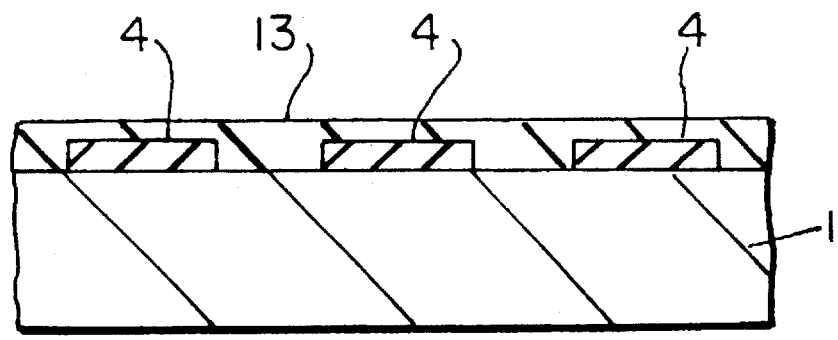
FIGS. 2(a) and 2(b) are cross sectional views of the main portion of a semiconductor wafer showing another example of the resist-removing method of the present invention.
Figure 2B:
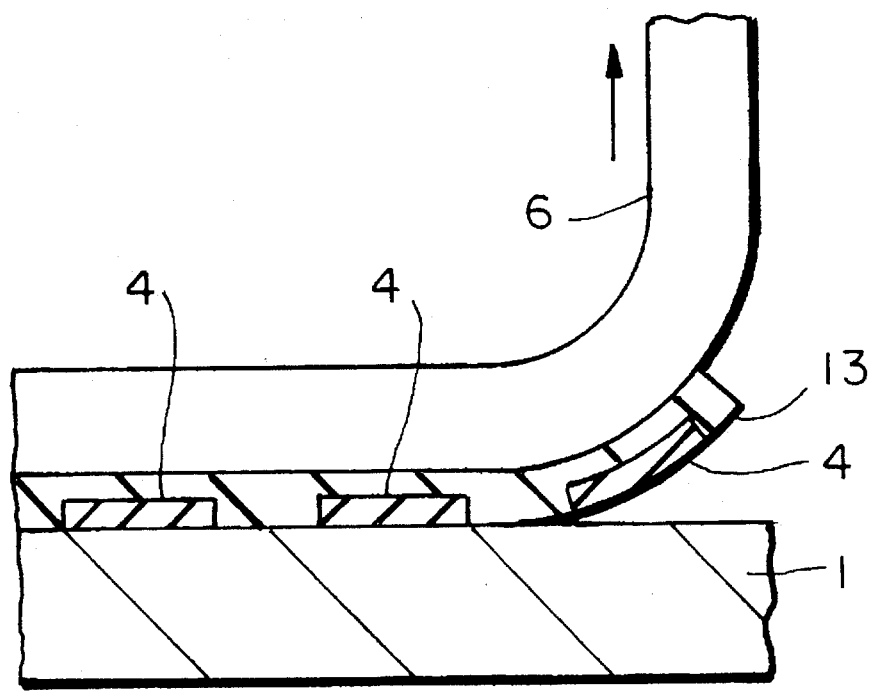

FIG. 2 is a cross sectional view of the main portion of a semiconductor substrate 1 showing another example (Embodiment 2) of the resist-removing method of the present invention.

In the resist-removing method of Embodiment 2 of the present invention, in the semiconductor wafer 1, for example, a dry etching step of which has been finished, a filler 13 is embedded in gaps of the resist pattern 4 as shown in FIG. 2 (a) prior to transporting the semiconductor wafer 1 to the adhesive tape adhering step [A] described above on FIG. 1.

The filler 13 comprises a material having an adhesion to the resist pattern 4, such as the photoresist having the same composition as the resist pattern 4. For embedding the photoresist in the gaps of the resist pattern 4, the photoresist is spin-coated on the resist pattern 4 and the semiconducter wafer 1 is then heated to cure the photoresist.

The semiconductor wafer 1 is then transported to the adhesive tape adhering step [A], and after closely adhering the adhesive tape 6 to the filler 13, the resist pattern 4 is peeled off according to the same manner as in Embodiment 1 described above as shown in FIG. 2 (b).

Thus, according to the resist-removing method of Embodiment 2 of the present invention, the contact area of the resist pattern 4 and the adhesive tape 6 can be substantially increased, whereby the resist pattern can be more certainly peeled off.

Also, by embedding the filler 13 in the gaps of the resist pattern 4, the adhesive coated on the adhesive tape 6 is not directly contacted with the surface of the semiconductor wafer 1, whereby after peeling off the adhesive tape 6, adhesive residue does not remain in the semiconductor wafer 1.

Thus, according to Embodiment 2 described above, the wafer washing step [D] and the wafer inspecting step [E] can be simplified.

In the embodiments described above, it was described that for strengthening the adhesion between the adhesive tape 6 and the resist pattern, the adhesive stregthening means 7 might be employed together with other steps, but by selecting the adhesive constituting the adhesive tape 6, the resist pattern can be more effectively peeled off.

Such the adhesive is an adhesive having a good affinity with a resist material on an article and being cured upon heating or light irradiation. As the adhesive particularly meeting the object, a curable pressure-sensitive adhesive comprising a pressure-sensitive adhesive polymer containing a non-volatile compound having at least one unsaturated double bond in the molecule and having a good affinity with a resist material is preferably used in the present invention.

The curable pressure-sensitive adhesive has a good pressure-sensitive function based on the pressure-sensitive adhesive polymer, and the non-volatile compound having a good affinity with a resist material contained in the curable pressure-sensitive adhesive contributes to integrate the resist material and the adhesive and has a function of polymerization-curing upon heating or irradiation with light by the action of the unsaturated double bond contained in the molecule.

Various conventional polymers which can be applied for general pressure-sensitive adhesives can be used as the pressure-sensitive polymer, and the particularly preferable polymer is an acrylic polymer comprising an acrylic acid alkyl ester and/or a methacrylic acid alkyl ester as the main monomer.

The acrylic polymer can be obtained by polymerizing the main monomer, i.e., the ester of acrylic acid or methacrylic acid and an alcohol having 12 or less carbon atoms together with, if necessary, a monomer having a carboxyl group or a hydroxyl group and other modifying monomer(s) by a conventional method such as a solution polymerization, an emulsion polymerization, a suspension polymerization, a bulk polymerization, etc.

Examples of the carboxyl group-containing monomer which can be used include acrylic acid, maleic acid, itaconic acid, etc., and examples of the hydroxyl group-containing monomer which can be used include hydroxyethyl acrylate, hydroxypropyl acrylate, etc.

The amount of the monomer containing a carboxyl group or a hydroxyl group used is usually 20% by weight or less based on the weight of the total monomers.

Examples of the above modifying monomer which can be used include vinyl acetate, vinyl propionate, styrene, acrylonitrile, acrylamide, glycidyl methacrylate, etc.

The amount of the modifying monomer used is usually 50% by weight or less based on the total weight of the main monomer and the modifying monomer.

It is preferred that the acrylic polymer comprising the monomers described above usually has a weight average molecular weight of from 300,000 to 2,000,000.

If the molecular weight of the acrylic polymer is too low, the viscosity of the composition prepared by compounding the acrylic polymer with the non-volatile compound becomes low, whereby the composition is liable to cause an inconvenience of flowing during the storage thereof, and if the molecular weight is too high, the composition is liable to cause a problem on handling.

Also, in view of the workability at peeling off the resist, it is preferred that the acrylic polymer has a glass transition point of 250° K. or less. If the glass transition point thereof is higher than 250° K., the adhesive becomes too hard after curing, whereby peeling of the adhesive tape tends to become stiff. However, the present invention does not intend to exclude the use of all the acrylic polymers having such a high glass transition point and as the case may be, the acrylic polymer having a high glass transition point can be used.

The non-volatile compound which is compounded with the pressure-sensitive adhesive polymer such as the acrylic polymer described above has a function that after adhering the adhesive tape onto an article having formed thereon a resist pattern, the adhesive is integrated with the resist material by the action of the compound and then cured as described above. Accordingly, it is required for the non-volatile compound to have at least one unsaturated double bond curable by heat or light in the molecule and have a good affinity with the resist material, and further required to have a good compatibility with the pressure-sensitive adhesive polymer and to not flow out at the storage thereof.

The term "having a good affinity with a resist material" used herein means that the phenomenon to solve or swell the resist material is remarkable and includes a phenomenon to transfer or diffuse into the resist material. A non-volatile compound is generally determined to have a good affinity in the case that when a resist material from which a solvent has been sufficiently dried off is immersed in a non-volatile compound at 130° C. for 24 hours, the resist material is dissolved therein or the weight of the resist material took out therefrom is at least twice the original weight, that is, the degree of swelling of the resist material for the volatile compound is at least about 2.

Also, the term "non-volatile compound" used herein means that the compound is not easily volatilized off in the coating and drying steps of the adhesive.

Specific examples of such a non-volatile compound are phenoxypolyethylene glycol (meth)acrylate, $\epsilon$-caprolactone (meth)acrylate, polyethylene glycol di(meth)acrylate, polypropylene glycol di(meth)acrylate, triemthylolpropane tri(meth)acrylate, dipentaerythritol hexa(meth)acrylate, urethane (meth)acrylate, epoxy (meth)acrylate, and oligoester (meth)acrylate.

Those compounds are used alone or as a mixture thereof according to the type of a pressure-sensitive adhesive polymer used and the type of a resist material peeled off.

It is preferred that the amount of the non-volatile compound used is usually from 20 to 200 parts by weight per 100 parts by weight of the pressure-sensitive adhesive polymer. If the amount thereof is too small, the resist-peeling effect is insufficient and if the amount thereof is too large, the adhesive undesirably flows out at the storage thereof.

In the curable pressure-sensitive adhesive containing the pressure-sensitive adhesive polymer and the non-volatile compound, it is preferred to increase the cohesive force by crosslinking the pressure-sensitive adhesive polymer from the point of the workability in the case of adhering the adhesive tape to an article such as a semiconductor wafer, etc. For example, an acrylic polymer obtained by copolymerizing a monomer containing a carboxyl group or a hydroxyl group is used as the pressure-sensitive adhesive polymer, a polyfunctional compound reactive with the functional group of the polymer, such as a polyisocyanate, a polyepoxy, a metal salt, a chelate compound, etc., is contained in the adhesive, and the above-described reaction may be accelerated in the step of forming a sheet-form, etc., to crosslink the polymer.

The amount of the polyfunctional compound used is usually 20 parts by weight or less per 100 parts by weight of the pressure-sensitive adhesive polymer. The amount of the polyfunctional compound can be suitably selected in the above-described range such that if the molecular weight of the polymer is low, the amount of the polyfunctional compound is large and if the molecular weight of the polymer is high, the amount of the polyfunctional compound is small. If the amount of the polyfunctional compound is too large, the adhesion of the adhesive is undesirably decreased.

Further, the curable pressure-sensitive adhesive may contain a filler such as silica fine powder, etc., by the same purpose as the use of the polyfunctional compound. Furthermore, the adhesive of the present invention may contain, if necessary, conventional additives such as a tackifying resin, a coloring agent, an antioxidant, etc., in an ordinary amount.

To the curable pressure-sensitive adhesive which can contain various kinds of components as described above is further added a polymerization initiator according to the curing means. For example, in the case of heat curing, a thermal polymerization initiator generating a radical upon heating, such as benzoyl peroxide, azobisisobutyronitrile, etc., are used, and in the case of light-curing with ultraviolet rays, etc., a photopolymerization initiator generating a radical upon light irradiation, such as benzoin, benzoin ethyl ether, dibenzyl, etc., are used.

The polymerization initiator is usually used in an amount of from 1 to 10 parts by weight per 100 parts by weight of the pressure-sensitive adhesive polymer.

The curable pressure-sensitive adhesive is desirably prepared such that the initial modulus of elasticity, that is, the modulus of elasticity before curing is usually from about 0.5 to 50 g/mm$^2$ and the modulus of elasticity becomes at least 5 times the initial modulus of elasticity after curing, in particular the modulus of elasticity becomes from about 3 to 400 g/mm$^2$ after curing.

This is because, when the modulus of elasticity of the curable pressure-sensitive adhesive is controlled as described above, good results are obtained for the pressure-sensitive adhesive characteristics thereof before curing and for the resist-peeling off property after curing.

The modulus of elasticity of the curable pressure-sensitive adhesive can be easily controlled by properly selecting the type of the pressure-sensitive adhesive polymer, the amounts of the non-volatile compound and other compounding components added to the polymer, the degree of crosslinking with the polyfunctional compound, the curing condition, etc.

In addition, the modulus of elasticity of the curable pressure-sensitive adhesive means the value measured by the method of applying a tensile test to the adhesive having a cross sectional area of 5 mm$^2$ at a temperature of 23° C.±2° C. and a tensile speed of 50 mm/minute with a bench mark line of 10 mm to obtain a stress-strain curve and obtaining the modulus of elasticity from the initial inclination of the curve.

The curable pressure-sensitive adhesive of the present invention may be formed, as the case may be, in a sheet form or a tape form by itself for the use for the purpose described above, but the curable pressure-sensitive adhesive is usually coated on a film substrate at a dry thickness of from about 10 to 180 μm to provide a resist-removing adhesive sheet or tape.

A film of a resin such as polyethylene, polypropylene, polyethylene terephthalate, etc., having a thickness of usually from about 12 to 100 μm is used as the film substrate. In particular, in the case of curing the adhesive by irradiation with light, a resin film which transmits light such as ultraviolet rays are selectively used.

In the resist-removing method of the present invention, the adhesive sheet using the curable pressure-sensitive adhesive having the construction described above is adhered to the surface of an article having formed thereon a resist pattern, and after integrating the resist material and the adhesive, the adhesive is subjected to a curing treatment by heating or by irradiation with light. In the case of taking the thermal influence onto an article such as a semiconductor wafer, etc., into consideration, the curing treatment by irradiation with light is particularly suitable and the irradiation dose is preferably in the range of from 300 to 3,000 mj/cm$^2$ in the case of using ultraviolet rays.

By the curing treatment, the adhesive is cured in the state that the adhesive is integrated with the resist material to greatly increase the modulus of elasticity thereof as described above, whereby the adhesion between the resist material and the article such as a semiconductor wafer is greatly decreased. As a result, by peeling off the adhesive sheet after curing, the resist material on the article is easily and completely peeled off together with the adhesive sheet in one body.

By the method of the present invention for removing a resist material as described above, there is no problem to require a long time for the resist-removing work and inject impurity ions in the resist material into a wafer as in the conventional method using an asher and, in particular, there is no problem to contaminate the working environment as the conventional method using an organic solvent.

As described above, according to the resist-removing method of the present invention, the following merits are obtained.

(1) Since the resist pattern 4 formed on the semiconductor wafer 1 is mechanically peeled off using the adhesive tape 6, metallic impurities contained in the photoresist do not remain on the semiconductor wafer 1 as remained in the case of the conventional ashing system, whereby the contamination of the semiconductor wafer 1 with the metallic impurities contained in the photoresist can be surely prevented by the method of the present invention.

(2) Even the resist pattern 4 denatured by an ion injection can be easily removed.

(3) By the merits (1) and (2) described above, the production yield and the reliability of semiconductor integrated circuit producing apparatus can be improved.

(4) Since the adhesive sheet using the specific curable pressure-sensitive adhesive is adhered to the semiconductor wafer 1 having formed thereon the resist pattern and after curing the adhesive, the adhesive sheet and the resist are peeled off in one body, the object of removing the resist easily and surely can be attained without accompanying the problems of injecting impurity ions contained in the resist materials into the semiconductor wafer and damaging the working environment.

The present invention is further explained by referring to the following examples, in which the parts are all by weight.

EXAMPLE 1

A monomer mixture of 80 parts of n-butyl acrylate, 15 parts of ethyl acrylate, and 5 parts of acrylic acid was solution-polymerized using 150 parts of ethyl acetate and 0.1 part of azobisisobutyronitrile at 60° C. for 12 hours under a nitrogen gas stream to obtain a solution of an acrylic polymer having a weight average molecular weight of 560,000 and a glass transition point of 231° K.

To 250 parts of the acrylic polymer solution thus obtained were added 100 parts of urethane acrylate (UA-101H, trade name, made by Kyoueisha Yushi Kagaku Kogyo K.K.), 3 parts of benzyl dimethyl ketal, and 3 parts of diphenylmethane diisocyanate followed by uniformly mixing to obtain a curable pressure-sensitive adhesive solution.

The curable pressure-sensitive adhesive solution was coated on a polyester film having a thickness of 50 μm at a dry thickness of 50 μm and dried at 150° C. for 10 minutes to obtain a resist-removing adhesive tape.

Comparative Example 1

After preparing a pressure-sensitive adhesive solution by uniformly mixing 250 parts of the acrylic polymer solution prepared in Example 1 with 3 parts of diphenylmethane diisocyanate, the solution was coated on a polyester film in the same manner as in Example 1 to obtain a resist-removing adhesive tape.

EXAMPLE 2

A monomer mixture of 60 parts of 2-ethylhexyl acrylate, 30 parts of butyl acrylate, 5 parts of vinyl acetate, and 5 parts of acrylic acid was polymerized by the same method as in Example 1 to obtain a solution of an acrylic polymer having a weight average molecular weight of 620,000 and a glass transition point of 207° K.

To 250 parts of the acrylic polymer solution thus obtained were added 100 parts of oligoester acrylate (Afronix M-5400, trade name, made by Toagosei Chemical Industry Co., Ltd.), 5 parts of benzyl methyl ketal, and 3 parts of tolylene diisocyanate followed by uniformly mixing to obtain a curable pressure-sensitive adhesive solution, and the solution was coated on a polyester film in the same manner as in Example 1 to obtain a resist-removing adhesive tape.

On each of the adhesive tapes obtained in Examples 1 and 2 and Comparative Example 1, the initial modulus of elasticity of the pressure-sensitive adhesive was determined. Also, in particular, each of the adhesive tapes obtained in Examples 1 and 2 was cured by irradiating with ultraviolet rays using a high-pressure mercury lamp at an irradiation dose of 1,000 mj/cm$^2$, and the modulus of elasticity of the adhesive was determined. The results obtained are shown in the Table below.

TABLE

| | Initial Modulus of Elasticity (g/mm$^2$) | Modulus of Elasticity after Curing (g/mm$^2$) |
|---|---|---|
| Example 1 | 9.5 | 110.5 |
| Example 2 | 5.3 | 80.2 |
| Comparative Example 1 | 13.4 | — |

EXAMPLE 3

A resist pattern was formed on a silicone wafer by coating a resist composed of novolak having a structure represented by the formula

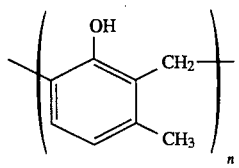

and quinondiazide on the surface of the silicone wafer followed by an image-exposure and a development, and after adhering the adhesive tape prepared in Example 1 onto the resist pattern, the assembly was irradiated with ultraviolet rays using a high-pressure mercury lamp at an irradiation dose of 1,000 mj/cm$^2$ to cure the pressure-sensitive adhesive.

When, after curing, the adhesive tape was peeled off, the resist was peeled off together with the adhesive tape. When the surface of the silicone wafer was observed by a fluorescent microscope, any resist material was not observed.

EXAMPLE 4

When the resist-peeling off treatment was conducted in the same manner as in Example 3 using the adhesive tape prepared in Example 2, the good result as obtained in Example 1 was obtained.

Comparative Example 2

When the resist-peeling off treatment was conducted in the same manner as in Example 3 using the adhesive tape prepared in Comparative Example 1, the adhesive tape only was peeled off and almost all the resist remained on the surface of the silicone wafer.

The present invention was practically described above based on the examples but the invention is not limited to those examples and various modifications can be possible within the scope of the present invention.

For example, by conducting the removal of the resist pattern in vacuum or a clean gas atmosphere, dry etching or the ion injection and the resist removal can be continuously conducted in the same apparatus.

In the above examples, the case of applying the present invention to the removal of the resist pattern formed on the semiconductor wafer was explained, but the present invention can be applied to the removal of the resist pattern used in the production steps of image pickup devices such as CCD elements, etc., and liquid crystal elements, etc.

While the invention has been described in detail and with reference to specific examples thereof, it will be apparent to one skilled in the art that various changes and modifications can be made therein without departing from the spirit and scope thereof.

What is claimed is:

1. A resist-removing method, which comprises:
   a step of adhering an adhesive tape having a curable pressure-sensitive adhesive layer which contains a non-volatile compound having a good affinity with a resist material and wherein said pressure sensitive adhesive layer has an initial modulus of elasticity of at least 0.5 g/mm$^2$, and is prepared such that its modulus of elasticity after curing is at least 5 times its modulus of elasticity before curing, on an upper surface of a resist pattern formed on an article,
   a step of transferring and diffusing the non-volatile compound into the resist pattern,
   a step of applying a curing treatment to the adhesive after the step of adhering the adhesive tape, and
   a step of peeling off the resist pattern together with the adhesive tape.

2. The resist-removing method of claim 1, wherein prior to the step of adhering the adhesive tape onto the upper surface of the resist pattern, a filler is embedded in gaps of the resist pattern.

* * * * *